United States Patent
Padmanabhan et al.

(10) Patent No.: US 10,593,666 B2
(45) Date of Patent: Mar. 17, 2020

(54) METHOD OF FORMING A HETEROJUNCTION SEMICONDUCTOR DEVICE HAVING INTEGRATED CLAMPING DEVICE

(71) Applicant: SEMICONDUCTOR COMPONENTS INDUSTRIES, LLC, Phoenix, AZ (US)

(72) Inventors: Balaji Padmanabhan, Tempe, AZ (US); Prasad Venkatraman, Gilbert, AZ (US); Zia Hossain, Tempe, AZ (US); Chun-Li Liu, Scottsdale, AZ (US); Jason McDonald, Gilbert, AZ (US); Ali Salih, Mesa, AZ (US); Alexander Young, Scottsdale, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/215,870

(22) Filed: Dec. 11, 2018

(65) Prior Publication Data
US 2019/0123041 A1    Apr. 25, 2019

Related U.S. Application Data

(62) Division of application No. 15/648,211, filed on Jul. 12, 2017, now Pat. No. 10,199,373, which is a
(Continued)

(51) Int. Cl.
*H01L 29/20* (2006.01)
*H01L 27/06* (2006.01)
(Continued)

(52) U.S. Cl.
CPC ........ *H01L 27/0629* (2013.01); *H01L 21/743* (2013.01); *H01L 21/8258* (2013.01);
(Continued)

(58) Field of Classification Search
CPC ............... H01L 21/743; H01L 21/8258; H01L 23/3677; H01L 23/481; H01L 27/0255;
(Continued)

(56) References Cited

U.S. PATENT DOCUMENTS 6,404,045 B1    6/2002 Pelly
7,586,156 B2    9/2009 Yedinak et al.
(Continued)

*Primary Examiner* — Long K Tran
(74) *Attorney, Agent, or Firm* — Kevin B. Jackson

(57) ABSTRACT

A cascode switch structure includes a group III-V transistor structure having a first current carrying electrode, a second current carrying electrode and a first control electrode. A semiconductor MOSFET device includes a third current carrying electrode electrically connected to the first current carrying electrode, a fourth current carrying electrode electrically connected to the first control electrode, and a second control electrode. A first diode includes a first cathode electrode electrically connected to the second current carrying electrode and a first anode electrode. A second diode includes a second anode electrode electrically connected to the first anode electrode and a second cathode electrode electrically connected to the fourth current carrying electrode. In one embodiment, the group III-V transistor structure, the first diode, and the second diode are integrated within a common substrate.

20 Claims, 8 Drawing Sheets

Related U.S. Application Data division of application No. 14/853,720, filed on Sep. 14, 2015, now Pat. No. 9,748,224.

(60) Provisional application No. 62/069,761, filed on Oct. 28, 2014.

(51) Int. Cl.

| | | |
|---|---|---|
| *H01L 21/8258* | (2006.01) | |
| *H01L 21/74* | (2006.01) | |
| *H01L 23/367* | (2006.01) | |
| *H01L 29/417* | (2006.01) | |
| *H01L 29/778* | (2006.01) | |
| *H01L 29/10* | (2006.01) | |
| *H01L 27/02* | (2006.01) | |
| *H01L 29/872* | (2006.01) | |
| *H01L 23/48* | (2006.01) | |
| *H01L 29/861* | (2006.01) | |

(52) U.S. Cl.
CPC ...... *H01L 23/3677* (2013.01); *H01L 27/0255* (2013.01); *H01L 27/0266* (2013.01); *H01L 27/0688* (2013.01); *H01L 29/1087* (2013.01); *H01L 29/41766* (2013.01); *H01L 29/7783* (2013.01); *H01L 23/481* (2013.01); *H01L 29/2003* (2013.01); *H01L 29/861* (2013.01); *H01L 29/872* (2013.01); *H01L 2224/40245* (2013.01); *H01L 2224/48247* (2013.01); *H01L 2924/0002* (2013.01)

(58) Field of Classification Search
CPC ............. H01L 27/0266; H01L 27/0629; H01L 27/0688; H01L 2924/0002; H01L 29/1087; H01L 29/2003; H01L 29/41766; H01L 29/7783; H01L 29/861; H01L 29/872
USPC ........................................................ 257/192
See application file for complete search history.

(56) References Cited

U.S. PATENT DOCUMENTS

| | | |
|---|---|---|
| 7,859,057 B2 | 12/2010 | Yedinak et al. |
| 8,357,976 B2 | 1/2013 | Yedinak et al. |
| 10,199,373 B2 * | 2/2019 | Padmanabhan ..... H01L 27/0629 |
| 2009/0072269 A1 | 3/2009 | Suh et al. |
| 2009/0166677 A1 | 7/2009 | Shibata et al. |
| 2010/0117095 A1 | 5/2010 | Zhang |
| 2010/0200920 A1 | 8/2010 | Su |
| 2011/0151628 A1 | 6/2011 | Su et al. |
| 2011/0210337 A1 | 9/2011 | Briere |
| 2011/0260174 A1 | 10/2011 | Hebert |
| 2012/0146133 A1 | 6/2012 | Hirler et al. |
| 2014/0048850 A1 | 2/2014 | Jeon et al. |
| 2015/0098163 A1 | 4/2015 | Ferrara et al. |
| 2015/0371987 A1 | 12/2015 | Pan et al. |
| 2016/0027771 A1 | 1/2016 | Su et al. |

\* cited by examiner

METHOD OF FORMING A HETEROJUNCTION SEMICONDUCTOR DEVICE HAVING INTEGRATED CLAMPING DEVICE

CROSS-REFERENCE TO RELATED APPLICATIONS

This application is a divisional application of co-pending U.S. application Ser. No. 15/648,211 filed on Jul. 12, 2017 and issued as U.S. Pat. No. 10,199,373 on Feb. 5, 2019, which is a divisional application of U.S. application Ser. No. 14/853,720 filed on Sep. 14, 2015 and issued as U.S. Pat. No. 9,748,224 on Aug. 29, 2017, which claims priority from U.S. Provisional Patent Application No. 62/069,761 filed on Oct. 28, 2014, all of which are hereby incorporated by reference.

BACKGROUND

The present invention relates, in general, to electronics and, more particularly, to semiconductor device structures and methods of forming semiconductor devices.

Gallium Nitride High Electron Mobility Transistors (GaN HEMTs), or generally III-nitride HEMTs, GaN Field Effect Transistors (FETs), or III-nitride transistors (and even more generally group III-V transistors), are known semiconductor devices and have experienced increased usage because of their high breakdown voltage and high switching speeds. Various applications have used group III-V transistors together with silicon diodes to provide, for example, a clamp structure to protect the group III-V transistor from electrical overstress. For example, some applications have used the silicon diode configured in parallel with the group III-V transistor with the anode connected to the source region of the group III-V transistor and the cathode connected to the drain region of the group III-V transistor.

Although group III-V transistors have been configured to operate as depletion mode devices (i.e., normally-on) or to operate as enhancement mode devices (i.e., normally-off), depletion mode devices have been easier to fabricate. One approach in providing a normally-off group III-V transistor has been to combine a normally-on group III-V transistor in a cascode configuration with a normally-off silicon metal oxide semiconductor FET (MOSFET). In such a configuration, the normally-off silicon MOSFET has been connected to the normally-on group III-V transistor in series (i.e., source of group III-V transistor connected to the drain of the silicon MOSFET) with the gate of the group III-V transistor connected to the source of the silicon MOSFET.

Unclamped inductive switching ("UIS") capability is one factor that determines the ruggedness of power semiconductor devices including group III-V transistors. UIS is one important parameter in certain applications involving an inductive load. During switching operations, the inductor can force a high voltage and high current condition, which can cause a high electrical stress on the power semiconductor device. In silicon semiconductor devices, because of the presence of an internal diode, the avalanche capability of such devices helps the device clamp the voltage and supply the necessary current before the energy is sent to ground. However, in the case of group III-V transistor devices, avalanche capability does not exist due to the absence of an internal diode. Thus, the reverse current will force an increase in the voltage at the drain of the device under UIS condition and eventually weaken or destroy the device. This problem further exists with cascode configurations because, among other things, the group III-V transistor has been placed between the load and the silicon MOSFET device and the internal diode of the silicon MOSFET cannot provide protection for the group III-V transistor.

Accordingly, structures and methods of integrating and/or making such structures are needed to improve the ruggedness of heterojunction power devices, such as group III-V transistor devices. It would be beneficial for such structures and methods to be cost effective and efficient for manufacturing integration, and to not detrimentally affect device performance.

Figure 1:
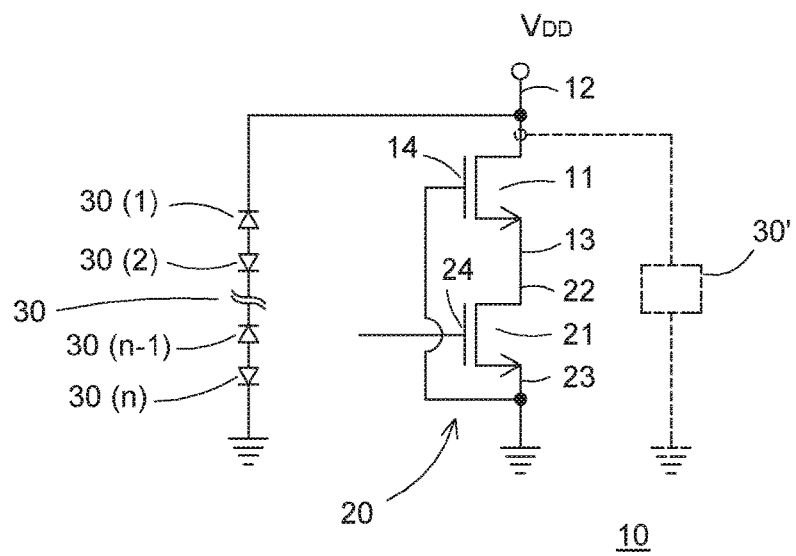
FIG. 1 illustrates a circuit schematic of a cascode switch structure including one or more clamping devices in accordance with embodiments of the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description. Also, the devices explained herein can be Ga-face GaN devices or N-face GaN devices. One of ordinary skill in the art understands that the conductivity type refers to the mechanism through which conduction occurs such as through conduction of holes or electrons, therefore, and that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles. Additionally, it is to be understood that where it is stated herein that one layer or region is formed on or disposed on a second layer or another region, the first layer may be formed or disposed directly on the second layer or there may be intervening layers between the first layer and the second layer. Further, as used herein, the term formed on is used with the same meaning as located on or disposed on and is not meant to be limiting regarding any particular fabrication process. Moreover, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. Additionally, the term integrated as used in herein generally means that described elements are incorporated within, partially within, and/or on a common semiconductor region or body.

DETAILED DESCRIPTION OF THE DRAWINGS

In the present description, a "group III-V" semiconductor device or similar terms pertains to a compound semiconductor structure including one or more group III elements and one or more group V elements. Examples include, but are not limited to indium aluminum gallium nitride (InAlGaN), indium gallium nitride (InGaN), gallium nitride (GaN), and similar compounds as known to those of ordinary skill in the art. Additionally, "III-nitride semiconductor" pertains to a compound semiconductor structure including one or more group III elements. Examples include, but are not limited to InAlGaN, InGaN, GaN, AlGaN, AlN, InN, and similar compounds as known to those of ordinary skill the art.

The present description is directed to a group III-V semiconductor device connected to a silicon-containing clamping device adapted to protect the group III-V semiconductor device from electrical stresses (for example, unclamped inductive switching or "UIS") by providing, among other things, a parallel conduction path to ground. In one embodiment, the group III-V semiconductor device is a normally-on transistor device and is further connected to a normally-off device (for example, a silicon-containing transistor or a silicon-containing diode) in a cascode configuration. In some embodiments, the substrate of the group III-V semiconductor device is connected to ground. In further embodiments, the substrate of the group III-V semiconductor device is configured to be connected with the source or anode of the normally-off device of the cascode configuration, which may or may not be connected to ground. In another embodiment, the substrate of the group III-V semiconductor device can be electrically floating. In other embodiments, the silicon-containing clamping device and the group III-V semiconductor device are integrated together within a common semiconductor substrate. In one preferred embodiment, the silicon-containing clamping device is configured to provide a current path that is generally perpendicular to the primary current path of the group III-V semiconductor device.

In one embodiment, a semiconductor device comprises a semiconductor substrate having a first major surface and an opposing second major surface. A heterostructure is adjacent the first major surface, the heterostructure comprising a channel layer and a barrier layer over the channel layer. A first electrode is disposed proximate to a first portion of the channel layer. A second electrode is disposed proximate to a second portion of the channel layer and spaced apart from the first electrode. A third electrode is disposed on the second major surface of the semiconductor substrate. A first control electrode is disposed between the first electrode and the second electrode and configured to control a first current path between the first electrode and the second electrode. A trench electrode extends through the heterostructure into the semiconductor substrate, wherein the trench electrode is electrically coupled to the first electrode. A clamping device is disposed in the semiconductor substrate and electrically coupled to the trench electrode and electrically coupled to the third electrode, wherein the clamping device is configured to provide a second current path generally perpendicular to the first current path.

In another embodiment, a semiconductor device comprises a semiconductor substrate having a first major surface and an opposing second major surface. A heterostructure is adjacent the first major surface, the heterostructure comprising a channel layer and a barrier layer over the channel layer. A first electrode disposed proximate to a first portion of the channel layer. A second electrode is disposed proximate to a second portion of the channel layer and spaced apart from the first electrode. A first control electrode is disposed between the first electrode and the second electrode and configured to control a first current path between the first electrode and the second electrode. A first trench electrode extends through the heterostructure into the semiconductor substrate, wherein the first trench electrode is electrically coupled to the first electrode. A clamping device is disposed in the semiconductor substrate and electrically coupled to the trench electrode and electrically coupled to a third electrode, wherein the clamping device is configured to provide a second current path.

In a further embodiment, a semiconductor device comprises a semiconductor substrate having a first major surface and an opposing second major surface. A heterostructure is adjacent the first major surface, the heterostructure comprising: a channel layer and a barrier layer over the channel layer. A first electrode is disposed proximate to a first portion of the channel layer, the first electrode comprising a plurality of first fingers attached to a first pad portion. A second electrode is disposed proximate to a second portion of the channel layer and spaced apart from the first electrode, the second electrode comprising a plurality of second fingers interdigitated with the plurality of first fingers and attached to a second pad portion. A third electrode disposed on the second major surface of the semiconductor substrate. A first control electrode is disposed between the first electrode and the second electrode and configured to control a first current path between the first electrode and the second electrode. A fourth electrode electrically coupled to the semiconductor substrate proximate to the first major surface and electrically coupled to the first electrode. A clamping device is disposed in the semiconductor substrate and electrically coupled to the fourth electrode and electrically coupled to the third electrode, wherein the clamping device is configured to provide a second current path generally perpendicular to the first current path.

In a still further embodiment, a cascode switch structure comprises a group III-V transistor structure having a first current carrying, a second current carrying electrode and a first control electrode. A semiconductor MOSFET device having a third current carrying electrode is electrically coupled to the first current carrying electrode, a fourth current carrying electrode is electrically coupled to the first control electrode, and a second control electrode. A first diode having a first cathode electrode is electrically coupled to the second current carrying electrode and a first anode electrode. A second diode having to second anode is electrically coupled to the first electrode and a second cathode is electrically coupled to the fourth current carrying electrode.

In another embodiment, a cascode switch structure comprises a normally-on group III-V transistor structure having a first current carrying, a second current carrying electrode and a first control electrode. A normally-off semiconductor MOSFET device has a third current carrying electrode electrically coupled to the first current carrying electrode, a fourth current carrying electrode electrically coupled to the first control electrode, and a second control electrode. A clamping device has a fifth current carrying electrode electrically coupled to the second current carrying electrode and a sixth current carrying electrode electrically coupled to the fourth current carrying electrode, wherein the clamping device and the normally-on group III-V transistor structure are integrated within a common substrate, and wherein the normally-on group III-V transistor structure provides a first current path for the cascode switch structure, and wherein the clamping device provides a second current path for the cascode switch structure generally perpendicular to the first current path.

FIG. 1 illustrates a circuit diagram of a switch structure 10 in accordance with one embodiment including a normally-on group III-V transistor device 11 and a normally-off silicon MOSFET device 21 in a cascode switch configuration 20.

In accordance with the present embodiment, switch structure 10 further includes a clamping device 30 with avalanche capability connected in parallel to cascode switch configuration 20. In one embodiment, clamping device 30 is configured to have a higher actual breakdown voltage in comparison to the rated breakdown voltage of cascode switch configuration 20.

In one embodiment, clamping device 30 can be a single device 30(a). In another embodiment, clamping device 30 can be a pair of back-to-back diodes. In a further embodiment, clamping device 30 can be multiple devices 30(1)-30(n), such as a plurality of diodes in a back-to-back configuration. In one embodiment, clamping device 30 can be a separate or external device from cascode switch configuration 20 in a freewheeling configuration. In one preferred embodiment, clamping device 30 is provided integral or integrated with group III-V transistor device 11.

Group III-V transistor device 11 includes a first current carrying electrode or source 13, a second current carrying electrode or drain 12, and control electrode or gate 14. MOSFET device 21 includes a first current carrying electrode or source 23, a second current carrying electrode or drain 22, and a control electrode or gate 24. In cascode switch configuration 20, drain electrode 12 is configured to be electrically connected to a load $V_{DD}$, such as an inductive load, source 13 is electrically connected to drain 22 of MOSFET device 21, source 23 of MOSFET 21 is electrically connected to gate 14 and, in one embodiment, is configured as a gate electrode of cascode switch configuration 14, which can be used to control the off/on state of the switch structure. As stated previously, the clamping device in accordance with the present embodiment can be in a freewheeling configuration as denoted by element 30, or can be integrated with group III-V transistor 11 and denoted by element 30'.

When cascode switch configuration 20 is connected to an inductive load at node $V_{DD}$, the switch structure can be exposed to a UIS condition (for example, high reverse voltage under large current conditions). The UIS characteristic determines the ruggedness of the switch structure under reverse bias conditions. In silicon devices, the avalanche capability of the device clamps the voltage, but this capability is not present in group III-V transistors. The present embodiments address this problem by providing clamping devices 30 and/or 30' in parallel with cascode switch configuration 20. In accordance with some embodiments, clamping device 30/30' can be a pn-junction diode device or a plurality of back-to-back pn-junctions devices (for example, single crystal or polycrystalline) is connected in parallel to cascode switch configuration 20 to breakdown during a reverse bias condition and to provide a current path to ground during electrical stress events. In an alternative embodiment, this principle in accordance with the present embodiments can be applied to a normally-on standalone FET device if the circuit is configured to provide a reverse gate voltage to turn the FET device off.

Figure 2:
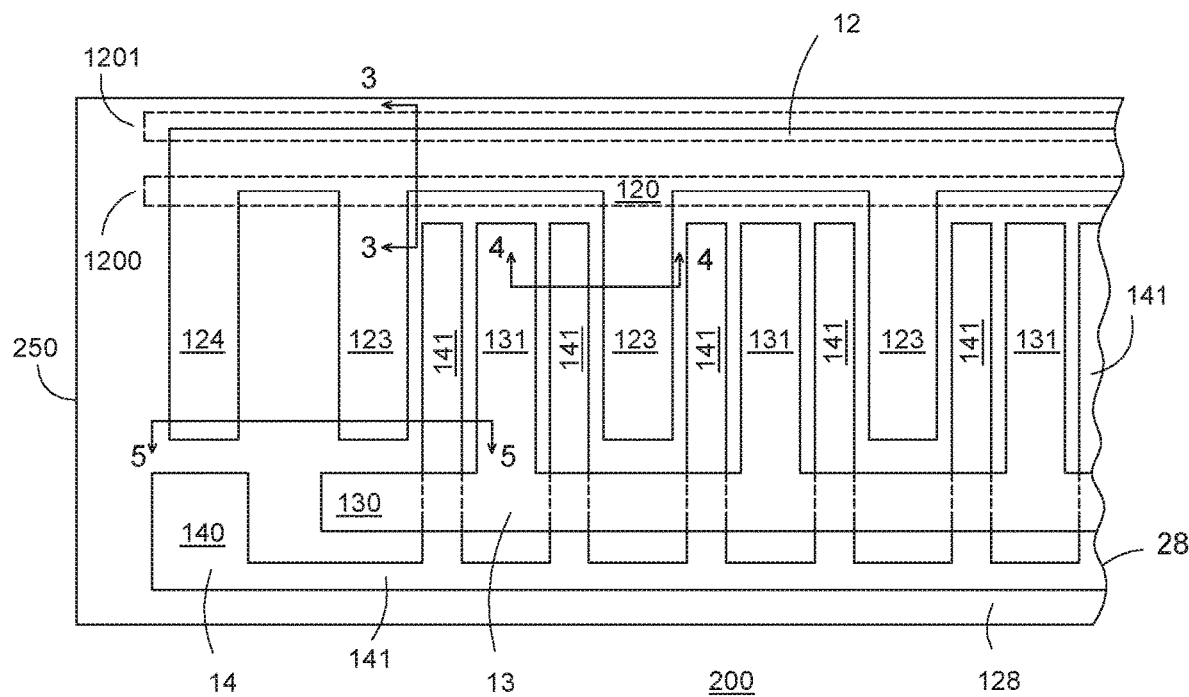
FIG. 2 illustrates a partial top plan view of a group III-V transistor structure with various configurations of an integrated clamping device in accordance with several embodiments of the present invention.
Figure 3:
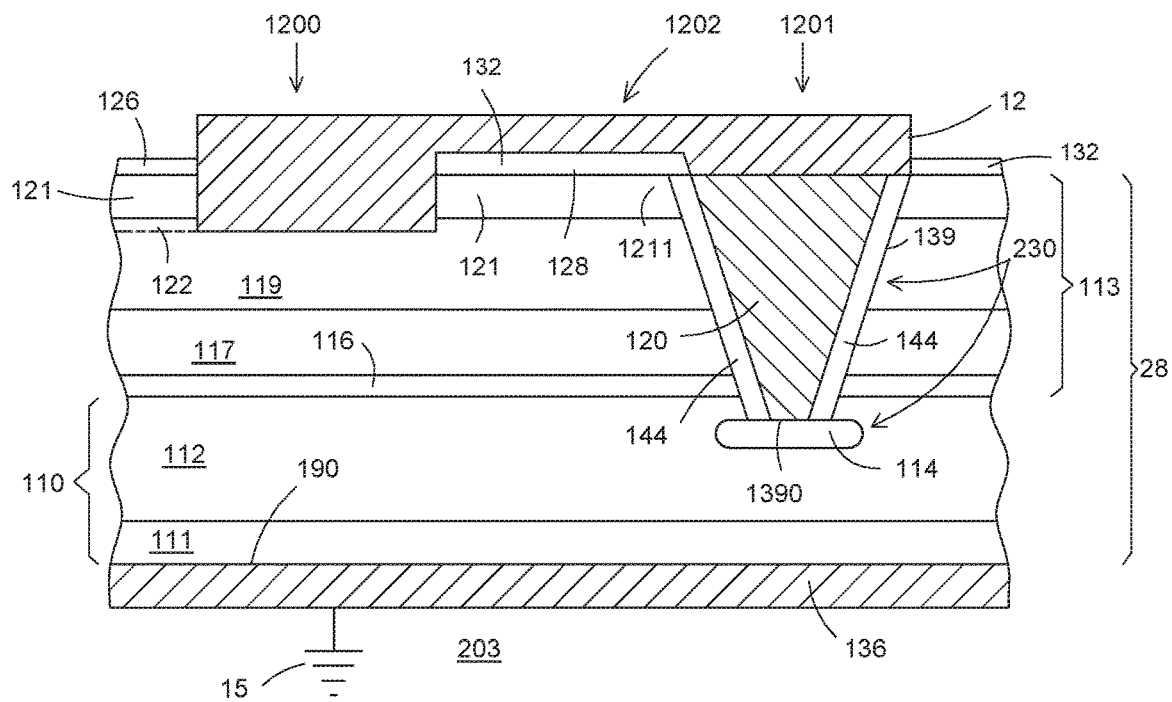
FIG. 3 illustrates a partial cross-sectional view of a group III-V transistor structure with an integrated clamping device in accordance with a first embodiment of the present invention taken along reference line 3-3 of FIG. 2.
Figure 4:
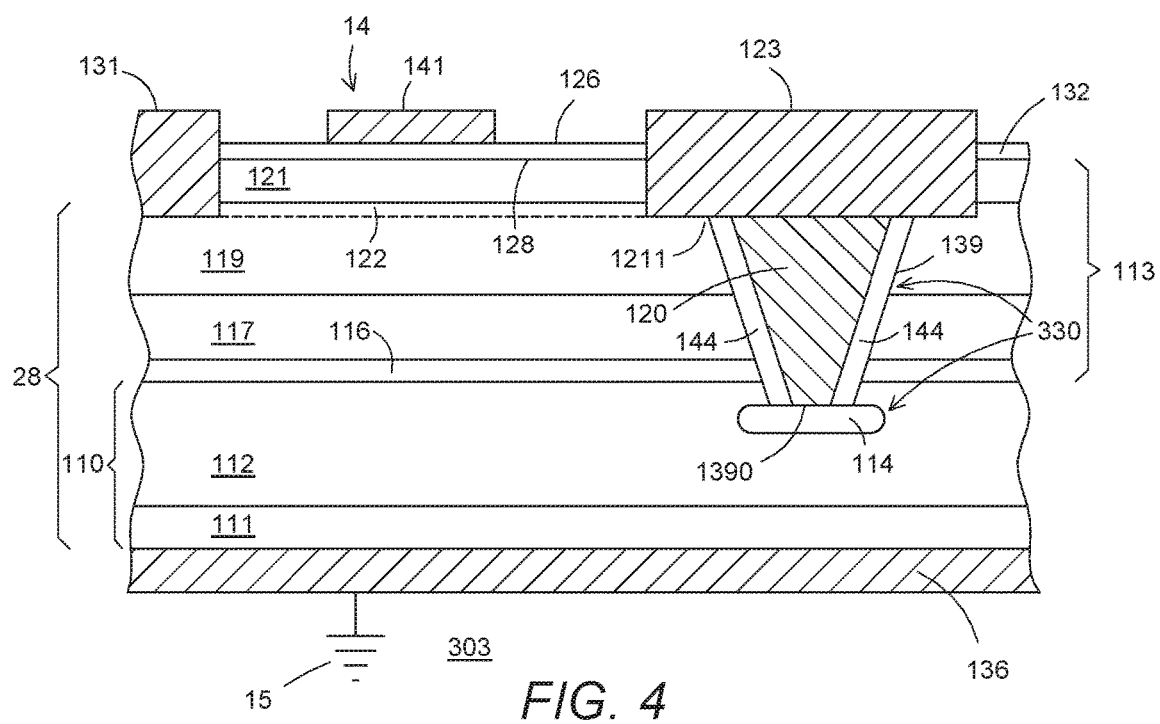
FIG. 4 illustrates a partial cross-sectional view of a group III-V transistor structure with an integrated clamping device in accordance with a second embodiment of the present invention taken along reference line 4-4 of FIG. 2.
Figure 5:
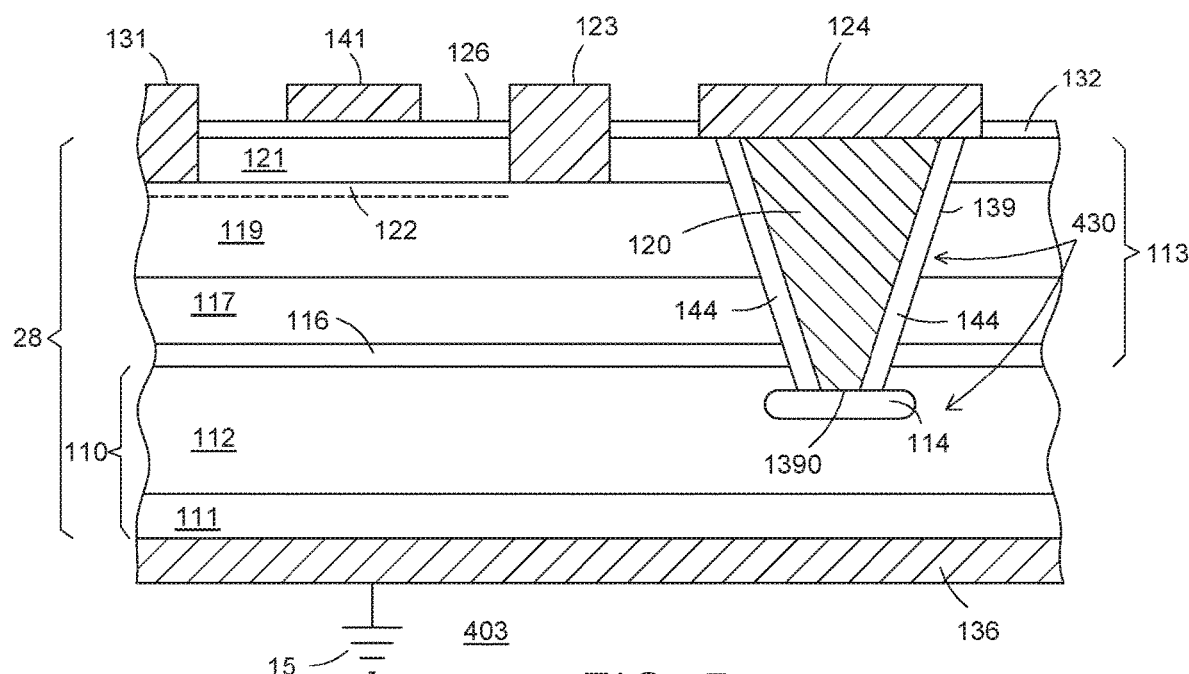
FIG. 5 illustrates a partial cross-sectional view of a group III-V transistor structure with an integrated clamping device in accordance with a third embodiment of the present invention taken along reference line 5-5 of FIG. 2.

FIG. 2 illustrates a partial top plan view of a group III-V transistor structure or device 200 having various configurations of a clamping device in accordance with several example embodiments, which will be further described in conjunction with FIGS. 3-5. Structure 200 is an embodiment of group III-V transistor 11 illustrated in FIG. 1, and includes a semiconductor substrate 28 having a major surface 128 where various conductive electrode patterns are provided. More particularly, in one embodiment structure 200 includes first current carrying electrode or source electrode 13, control electrode or gate electrode 14, and second current carrying electrode or drain electrode 12.

In some embodiments, drain electrode 12 can include a drain pad portion 120 and a plurality of spaced-apart drain finger portions or fingers 123 and 124 extending generally perpendicular from side surfaces of pad portion 120. In one embodiment, finger 124 is disposed towards an outer edge 250 of structure 200. Source electrode 13 can include a source pad portion 130 and a plurality of spaced-apart source finger portions or fingers 131 extending generally perpendicular from side surfaces of pad portion 130 in a direction generally towards pad portion 120. In this configuration, drain fingers 123 and source fingers 131 are disposed in an alternating or interdigitated manner or pattern as generally illustrated in FIG. 2. In one embodiment, gate electrode 14 can include a pad portion 140 and a plurality of gate runner portions 141 that extend between fingers 123 and 131. In one embodiment, pad portion 140 can be disposed proximate to edge 250 of structure 200. In some embodiments, gate runner 141 can be absent from that portion of structure 200 between finger 124 and its adjoining finger 123. In one embodiment, which will be described later in conjunction with FIG. 3, drain pad 120 can be configured in several parts including a drain contact part 1200 and a clamping device part 1201.

Drain electrode 12, source electrode 13, and gate electrode 14 can be conductive materials suitable for use in group III-V transistor devices. In some embodiments, aluminum alloy materials with seed and anti-reflective coating layers can be used. In some embodiments, titanium-nitride/aluminum-copper/titanium-nitride materials can be used and can be formed using, for example, evaporation, sputtering, and/or plating techniques. The foregoing materials including combinations thereof and combinations with doped polycrystalline semiconductor material can also be used for conductive electrodes 120, 720, and 920 described hereinafter. The layers can be patterned using photo-lithographic and etch techniques. In some embodiments, multiple layers of conductive materials can be used and insulated from each other with inter-level dielectric layers.

FIG. 3 illustrates a partial cross-sectional view of a group III-V transistor structure or device 203 with an integrated clamping device 230 in accordance with a first embodiment taken along reference line 3-3 of FIG. 2. In one embodiment, group III-V transistor structure 203 is configured as a normally-on device. In the present embodiment, group III-V transistor structure 203 includes semiconductor substrate 28, which can include a base substrate, base semiconductor substrate, a region of semiconductor material, semiconductor region, or semiconductor substrate 110. In several embodiments, substrate 110 is a silicon substrate having a (111) orientation. In other embodiments, substrate 110 can have other orientations. In other embodiments, substrate 110 can be silicon-carbide or other semiconductor materials. In one embodiment, substrate 110 includes a semiconductor region 112 and a doped region 111 that adjoins a major surface 190 of substrate 110. In a further embodiment, semiconductor substrate 110 can be provided without doped region 111 so that semiconductor region 112 adjoins major surface 190 of semiconductor substrate 110. Semiconductor region 112 can be an intrinsically doped region or can be a lightly doped region, such as a lightly doped p-type region. Semiconductor region 112 can be formed using epitaxial formation techniques or other techniques as known to those of ordinary skill in the art. In one embodiment, doped region 111 can be doped p-type and can a have graded dopant profile, such as a p+/p/p− profile where the p+ portion adjoins or is proximate to major surface 190 of substrate 110, and the dopant profile can decrease in a predetermined manner extending inward from major surface 190. Doped region 111 can be formed using ion implantation and diffusion techniques, epitaxial formation techniques, or other techniques as known to those of ordinary skill in the art.

In one embodiment, semiconductor substrate 28 includes a buffer layer or nucleation layer 116, a transition region 117, a channel layer 119, and a barrier layer 121 formed on or adjoining substrate 110. In some embodiments, buffer layer 116 can be, for example, an MN layer situated over substrate 110. Transition region 117 can be one or more AlGaN layers, where each layer can have different concentrations of Al. For example, the aluminum concentration can be higher in layers of transition region 117 closer to substrate 110 and the aluminum concentration can be lower in layers of transition region 117 closer to channel layer 119.

In other embodiments, transition region 117 can comprise a super lattice structure disposed on buffer layer 116 and one or more back barrier layers disposed on the super lattice structure. In one embodiment, the back barriers comprise AlGaN layers of different thickness, Al concentration and carbon concentration. In some embodiments, the AlGaN back barrier next to the super lattice can have about 8% Al, a thickness of about 0.2 um, a carbon concentration of about $1.0 \times 10^{18}$ atoms/cm$^3$. In some embodiments, the second AlGaN back barrier layer is disposed over of the first AlGaN back barrier with about 8% Al, a thickness of about 0.8 um, and a carbon concentration of about $3.0 \times 10^{16}$ atoms/cm$^3$ or less. In one embodiment, channel layer 119 comprising GaN is disposed over the second AlGaN back barrier layer and the GaN channel layer can have a carbon concentration of less than about $3.0 \times 10^{16}$ atoms/cm$^3$, and a typical thickness of from about 100 nm to about 200 nm.

Channel layer 119 can be formed situated over buffer layer 116 or optional transition layers 117. In several embodiments, channel layer 119 can be, for example, a GaN layer. In some embodiments, barrier layer 121 can be AlGaN and can be formed over channel layer 119. Buffer layer 116, transition layer(s) 117, channel layer 119, and barrier layer 121 provide a heterostructure 113 portion of semiconductor substrate 28, and in one embodiment, can be formed using metal organic chemical vapor deposition ("MOCVD") techniques or other formation techniques as known to those of ordinary skill in the art. At the interface of barrier layer 121 and channel 119 a two-dimensional electron gas (2DEG) layer or region 122 is created, as known to those of ordinary skill in the art. In other embodiments, wafer bonding techniques can be used to form the semiconductor substrate 28.

In the present embodiments, ion implantation techniques can be used to remove part of 2DEG region 122 in a portion 1211 of barrier layer 121 and channel layer 119 that is adjacent to where clamping device 230 adjoins channel layer 119 and barrier layer 121. In one embodiment, one or more nitrogen ion implant steps are used. In one embodiment, multiple ion implant doses and implant energies can be used. In some embodiments, the ion implant doses can the range from about $9.0 \times 10^{12}$ atoms/cm$^2$ to about $2.5 \times 10^{13}$ atoms/cm$^2$, and implant energies can range from about 30 keV to about 400 keV. In other embodiments, a shallow trench structure can be used to remove part of 2DEG region 122.

In some embodiments, group III-V transistor structure 203 can also include an insulation or insulative layer or layers 132 situated over portions of major surface 128 of semiconductor substrate 28, which can be, for example, silicon nitride, aluminum nitride, combinations thereof, or other insulative materials as known to those of ordinary skill in the art. In some embodiments, insulation layer 132 can be silicon nitride formed using plasma-enhanced chemical vapor deposition techniques ("PECVD"), low pressure chemical vapor deposition ("LPCVD"), metal organic chemical vapor deposition ("MOCVD"), or atomic layer deposition ("ALD"), and can have a thickness in some embodiments from about 0.1 microns to about 10.0 microns. In some embodiments, the silicon nitride forms a field plate that reduces the effect of the high electric fields that can be formed between the drain and gate regions.

In accordance with the present embodiment, a trench 139 is formed to extend from major surface 128 generally downward and extending through heterostructure 113, and into semiconductor region 112 of substrate 110. Trench 139 can be formed using photolithographic techniques and wet or dry etching techniques. In some embodiments, trench 139 is lined or covered with an insulating material or layer 144. Insulating layer 144 can be, for example, silicon oxide, silicon nitride, aluminum oxide, aluminum nitride, or other materials as known to those of ordinary skill in the art. Insulating layer 144 can be formed using PECVD techniques and/or atomic level deposition (ALD) techniques, and typically has a thickness sufficient to electrically isolate conductive electrode 120 from heterostructure 113. Portions of insulating layer 144 are removed from a bottom or lower surface 1390 of trench 139 to provide for electrical communication between conductive electrode 120 and semiconductor region 112. In some embodiments, insulating layer 144 is removed entirely from lower surface 1390 of trench 139 to expose a portion of semiconductor region 112 adjoining lower surface 1390. By way of example, an anisotropic etch process can be used to remove portions of insulating layer 144. In another example, a spacer process can be used to remove portions of insulating layer 144. Group III-V transistor structure 203 further includes a gate dielectric layer 126, which will be describe further in conjunction with FIG. 4.

In accordance with the present embodiment, a doped region 114 is disposed adjoining lower surface 1390 of trench 139. In one embodiment, doped region 114 can be an n-type region or a region with a graded dopant profile, such as n+/n/n− with the highest doping near lower surface 1390 of trench 139 and decreasing towards major surface 190 of semiconductor substrate 110. Doped region 114 can be formed using, for example, phosphorous or arsenic ion implantation and annealing techniques or other techniques as known to those of ordinary skill in the art. In an alternative embodiment, a series of ion implants can be used to create a predetermined a doping profile that provides, for example, a desired breakdown characteristic for clamping device 230. In one embodiment, the vertical distance from the lower surface of doped region 114 to the upper surface of doped region 111 can be between about 40 microns to about 90 microns for higher voltage applications (for example, about 400 volts to about 900 volts).

Trench 139 can be filled (which includes, but is not limited to completely filled) or lined (which includes, but is not limited to partially filled) with a conductive material to provide conductive electrode 120. In one embodiment, the conductive material can be used to further provide drain electrode 12 over a portion of major surface 128 so that conductive electrode 120 and drain electrode 12 are formed at the same time. In an alternative embodiment, conductive electrode 120 and drain electrode 12 can be formed in two separate steps using the same or different materials. By way of example, conductive electrode 120 can be one or more metals and/or a doped polycrystalline semiconductor material. Then, the conductive material can be patterned using, for example, photolithographic and etch techniques to provide drain electrode 12 as generally illustrated in FIG. 3. In the present embodiment, drain electrode 12 is provided in several parts including portion 1200, which makes contact with 2DEG layer 122 in the active part of group III-V structure 203, and portion 1201 that makes contact with clamping device 230. Portions 1200 and 1201 can be connected together, for example, with another portion 1202 as generally illustrated in FIG. 3. In accordance with present embodiment, portion 1201 overlaps the trench electrode, which includes trench 139 and conductive electrode 120, which provides one electrical contact (for example, a cathode electrode) for clamping device 230. One benefit of this configuration is that the lateral separation reduces electrical interaction between clamping device 230 and the ohmic contact between portion 1200 of drain electrode 12 and 2DEG region 122.

In accordance with one preferred embodiment, III-V transistor structure 203 further includes a conductive electrode 136 formed adjacent major surface 190 of substrate 110. In several embodiments, conductive electrode 136 can be a laminated structure of titanium-nickel-silver, chrome-nickel-gold, or other conductive materials as known to those of ordinary skill in the art. In accordance with the present embodiments, conductive electrode 136 is configured as an anode electrode of clamping device 230 and is configured in some embodiments to electrically connect with source 23 of MOSFET device 21 in the cascode configuration illustrated, for example, in FIG. 1. In some embodiments, conductive electrode 136 is configured preferably to be electrically connected to ground node 15 as generally illustrated in FIG. 3.

In accordance with the present embodiment, doped region 111, semiconductor region 112, and doped region 114 are configured as a p-i-n diode device as one embodiment of clamping device 230, which is integrated within III-V transistor structure 203 to provide a vertical current path, a vertical reverse voltage clamping capability, or a vertical avalanche capability for III-V transistor structure 203. Stated another way, clamping device 230 provides a current path that is generally perpendicular to the current path of the active group III-V transistor device, which advantageously provides a sinking of an avalanche event through major surface 190 of structure 203. This configuration provides, among other things, improved UIS performance for III-V transistor structure 203. In addition, the present embodiment forms the p-i-n clamping device in the silicon portion of the substrate, which provides the avalanche capability for the cascode switch structure 10. Also, the present embodiment reduces any interaction between the clamping device and the ohmic drain contact of the group III-V transistor device. This technique can also be used in the case of bond over active ("BOA") for other embodiments by extending the drain pad out of the finger regions to make the clamping device as will be described with several example embodiments described hereinafter.

Another benefit of this configuration is that trench 139 of the trench electrode is etched through heterostructure 113 into semiconductor region 112, which has been experimentally shown to reduce localized stresses in group III-V transistor structure 203. This facilitates reducing the thickness of heterostructure 113 thereby improving the thermal performance of group III-V transistor structure 203. Also, this configuration of the present embodiment helps in tuning the breakdown voltage of clamping device 230 by changing the thickness of the intrinsic region of semiconductor region 112. In other embodiments, doped region 111 is not used, and a Schottky diode is used as clamping device 230. In one embodiment, a Schottky barrier material can be used as part of or as conductive electrode 136. In the Schottky embodiment, semiconductor region 112 can be doped lightly n-type proximate to major surface 190 and doped region 114 can be doped heavier n-type to provide an ohmic contact to conductive electrode 120. It is understood that a Schottky diode can be used with one or more of the further embodiments described hereinafter. In other embodiments, dielectric liner 144 along the sidewalls of trench 139 can be excluded.

FIG. 4 illustrates a partial cross-sectional view of a group III-V transistor structure or device 303 with a clamping device 330 in accordance with a second embodiment taken along reference line 4-4 of FIG. 2. Group III-V transistor structure 303 is similar to group III-V transistor 203 and only the differences will be described hereinafter. Group III-V transistor structure 303 is an embodiment that provides the clamping device within one or more drain fingers 123. In some embodiments, group III-V transistor structure 303 further includes gate dielectric layer 126 situated over a portion of barrier layer 121 as generally illustrated in FIG. 4. In other embodiments, any of the group III-V transistors can be configured with a Schottky gate.

In some embodiments, gate dielectric region 126 can be silicon nitride, aluminum nitride, aluminum oxide, silicon dioxide or combinations thereof, hafnium oxide, or other materials as known to those of ordinary skill in the art. Control or gate electrode 14 (which can include gate runner 141) is situated over gate dielectric region 126, and can be, for example, aluminum with a titanium and/or titanium-nitride barrier or other conductive materials as known to those of ordinary skill in the art. In the present cross-sectional view, a source finger 131 is disposed adjacent barrier layer 121 and makes ohmic contact to 2DEG region 122 on an opposite side of gate electrode 14 from drain finger 123. It is understood that gate electrode 14/141 can be further configured with one or more field plate structures and/or that source electrode 13/131 can be further configured with one or more field plate structures.

In one embodiment, group III-V transistor structure 303 can be configured in a BOA configuration (i.e. without a separate drain bond pad). In such an embodiment, clamping device 330 can be integrated throughout drain fingers 123 of the structure. In the present embodiment, drain finger 123 overlaps the trench electrode (for example, trench 139 and conductive material 120). In one embodiment, the ohmic drain contact can be formed proximate to the 2DEG region 122 and trench 139 and conductive electrode 120 for contacting doped region 114 can be inset from one or more edges of drain fingers 123 to reduce any interference with the ohmic contact to 2DEG region 122. In one embodiment, clamping device 330 can be formed all along the length of drain fingers 123 and therefore provides a larger area for clamping device 330 to handle the UIS current. This is one advantageous feature of the present embodiment that scales with the length of the device and the UIS capability.

FIG. 5 illustrates a partial cross-sectional view of a group III-V transistor structure or device 403 with a clamping device 430 in accordance with a third embodiment taken along reference line 5-5 of FIG. 2. Group III-V transistor structure 403 is similar to group III-V transistors 203 and 303 and only the differences will be described hereinafter. In the present embodiment, clamping device 430 is provided as part of a separate drain finger 124, which is a spaced apart from 2DEG region 122 and drain finger 123 as generally illustrated in FIG. 5. In one embodiment, 2DEG region 122 between drain fingers 123 and 124 is removed using, for example, ion implantation techniques, for example, as described previously. In this embodiment, group III-V transistor structure 403 reduces electrical interference of clamping device 430 with the ohmic contact structure provided by drain finger 123. In some embodiments, group III-V transistor structure 403 is provide in a BOA configuration. In one embodiment, this can include one or more dedicated drain fingers 124 in addition to the source fingers 131 and the drain fingers 123. The distance between drain finger 124 and the adjacent drain finger 123 does not have to be a large distance to make sure that the pitch of the device does not significantly increase. In one embodiment, this distance can be in a range from 0.1 microns to about 100 microns.

The clamping concept of the present embodiments was tested by connecting a clamping diode (in a free-wheeling configuration) parallel to a cascode GaN rectifier and a normally-off switch. For the test, a 0.3 mH inductor was used for the measurements. More particularly, an ON Semiconductor MUR860, Ultra-Fast Recovery, Switch-mode, 8 Amp, 600 Volt Power Rectifier was used for the clamping diode. Table 1 provides a summary of the UIS test results. The clamping diode was tested initially and a UIS capability of 86.4 milli-Joules (mJ) was observed. A standalone cascode GaN rectifier resulted in a UIS energy of 3 mJ. As the current was ramped to failure, the voltage in the drain of the cascode system started increasing all the way to 1200V before the GaN rectifier device was destroyed. The cascode rectifier with the clamping diode in parallel clamped the drain voltage at approximately 800V and had a UIS energy of 66.2 mJ. Thus, with the clamping diode an approximately 20× increase in the UIS energy was achieved. A test on the cascode switch yielded similar result as shown in Table 1. In the UIS waveform, it was observed that the voltage is clamped (i.e. remains stable at around 800V) while the current is ramping down to zero. Thus, the clamping diode is providing a path for the UIS energy to sink to ground by going into avalanche and clamping the voltage. As the UIS energy/current returns to zero, the diode is no longer in avalanche and the voltage also goes back to zero.

TABLE 1

Group III-V Transistor with Clamping Diode for UIS

| Device | UIS Energy (mJ) | Drain Current (A) | Max BVR (V) | Test Conditions |
| --- | --- | --- | --- | --- |
| Silicon diode alone | 86.4 | 24 | 900 | 0.3 mH, pulse to fail |

TABLE 1-continued

Group III-V Transistor with Clamping Diode for UIS

| Device | UIS Energy (mJ) | Drain Current (A) | Max BVR (V) | Test Conditions |
|---|---|---|---|---|
| Cascode switch without clamp diode | 5.4 | 6 | 910 | 0.3 mH, pulse to fail |
| Cascode rectifier with clamp diode | >33, <60 | >15, <20 | 813 | 0.3 mH, single pulse at 15A plus pulse to fail |
| Cascode rectifier without clamp diode | 3 | 4.5 | 1200 | 0.3 mH, pulse to fail |
| Cascode rectifier with clamp diode | 66 | 21 | 761 | 0.3 mH, pulse to fail |

Relevant features of the present embodiments include, but are not limited to including or integrating a clamping device with a cascode group III-V transistor or any cascode configuration (to make a normally off device using a normally on device) to improve, among other things, the unclamped inductive switching capability. Also, in accordance with the present embodiments, the substrate of the cascode circuit can be preferably connected to the ground node (for example, ground node 15) of the entire cascode system to improve the dynamic on resistance characteristics. Additionally, providing a clamping device having a conduction path perpendicular to the main active conduction path of the group III-V transistor structure and stabilizing the midpoint voltage in the cascode switch structure in combination with the clamping diode for UIS capability are several distinctions over prior devices.

Figure 6:
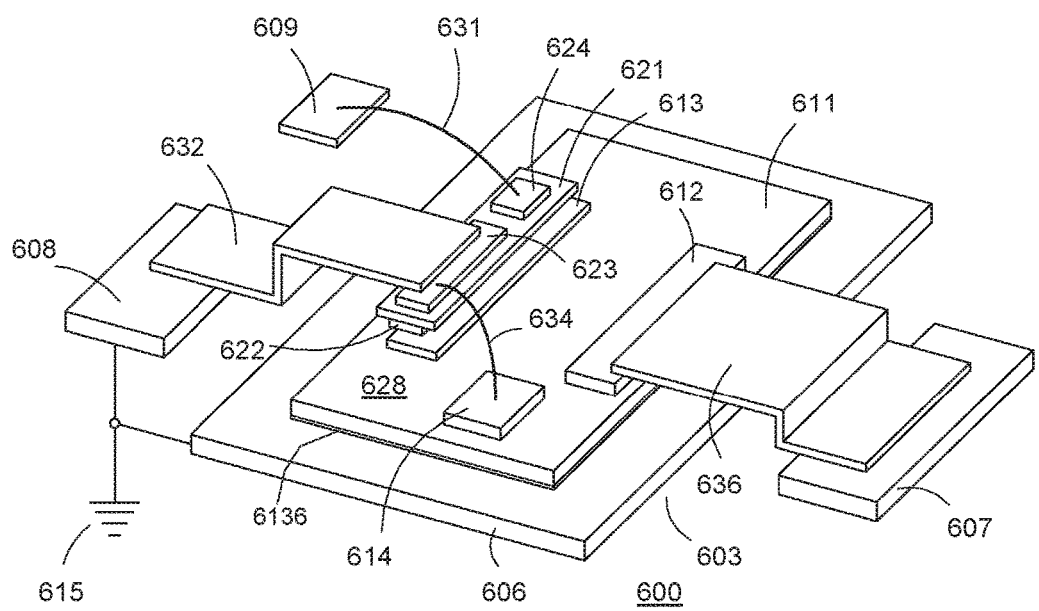
FIG. 6 illustrates a perspective top view of a partially assembled cascode configuration including a group III-V transistor structure with a clamping device in accordance with an embodiment of the present invention.

FIG. 6 illustrates a perspective top view of a partially assembled cascode configuration 600 including a normally-on group III-V transistor structure 611 with a clamping device and a normally-off MOSFET device 621 in accordance with one embodiment of cascode switch structure 20 illustrated in FIG. 1. In accordance with the present embodiment, cascode configuration 600 includes a substrate, such as a lead frame 603. In one embodiment, lead frame 603 includes a die pad, die paddle, or die attach pad 606 and a plurality of leads 607, 608, and 609. A group III-V transistor structure 611 having conductive electrode 136 is attached to die pad 606 using, for example, a conductive adhesive layer (not shown). In one embodiment, group III-V transistor structure 611 includes a drain electrode 612, a source electrode 613, and a gate electrode 614 disposed, for example, on major surface 628. By way of example, group III-V transistor structure 611 can be one of the group III-V transistor structure embodiments described herein and configured with a clamping device, such as clamping devices 30, 230, 330, 430, 707, 730, and/or 830, which provide a vertical current path through group III-V transistor structure 611 to die pad 606.

Cascode configuration 600 can further include a normally-off semiconductor device, such as normally-off silicon MOSFET 621. In one embodiment, drain electrode 622 of silicon MOSFET 621 is connected to source electrode 613 of group III-V transistor structure 611. By way of example, a conductive adhesive (not shown) or other conductive material as known to those of ordinary skill in the art can be used to attach drain electrode 622 to source electrode 613. Gate electrode 624 of silicon MOSFET 621 is connected to lead 609 using a conductive structure, such as a wire bond 631. Source electrode 623 of silicon MOSFET 621 is connected to lead 608 using a conductive structure, such as a clip 632. Source electrode 623 is further connected to gate electrode 614 of group III-V transistor structure 611 using a conductive structure, such as a wire bond 634. Drain electrode 612 of group III-V transistor structure 611 is connected to lead 607 using a conductive structure, such as a clip 636. Although not illustrated, cascode configuration 600 can further include a protective housing (for example, a lid or a molded encapsulant) covering group III-V transistor structure 611, silicon MOSFET 621, conductive structures 631, 632, 634, and 636, and at least portions of leads 607, 608, and 609 and die pad 606. Portions of leads 607, 608, and 609 and die pad 606 can be left exposed to facilitate attachment to a next level of assembly, such as a printed circuit board. In another embodiment, die pad 606 and lead 608 can be a unitary structure and clip 632 can be used to connect the substrate of transistor structure 611 to source electrode 623 of silicon MOSFET 621.

In accordance with the present embodiment, die pad 606 is configured to be connected to a ground node 615 as generally illustrated in FIG. 6. Additionally, die pad 606 can be further electrically connected to lead 608 as generally illustrated in FIG. 6. This can be facilitated, for example, using a printed circuit board. Alternatively, die pad 606 and lead 608 and be directly connected or source electrode 623 can be electrically connected to die pad 606. In a high energy event (for example, a UIS event), the integrated clamping device (for example, clamping devices 30, 230, 330, 430, 707, 730, and/or 830) with group III-V transistor structure 611 is configured to provide a vertical conduction path through group III-V transistor device 611 to ground thereby protecting group III-V transistor device 611.

Figure 7:
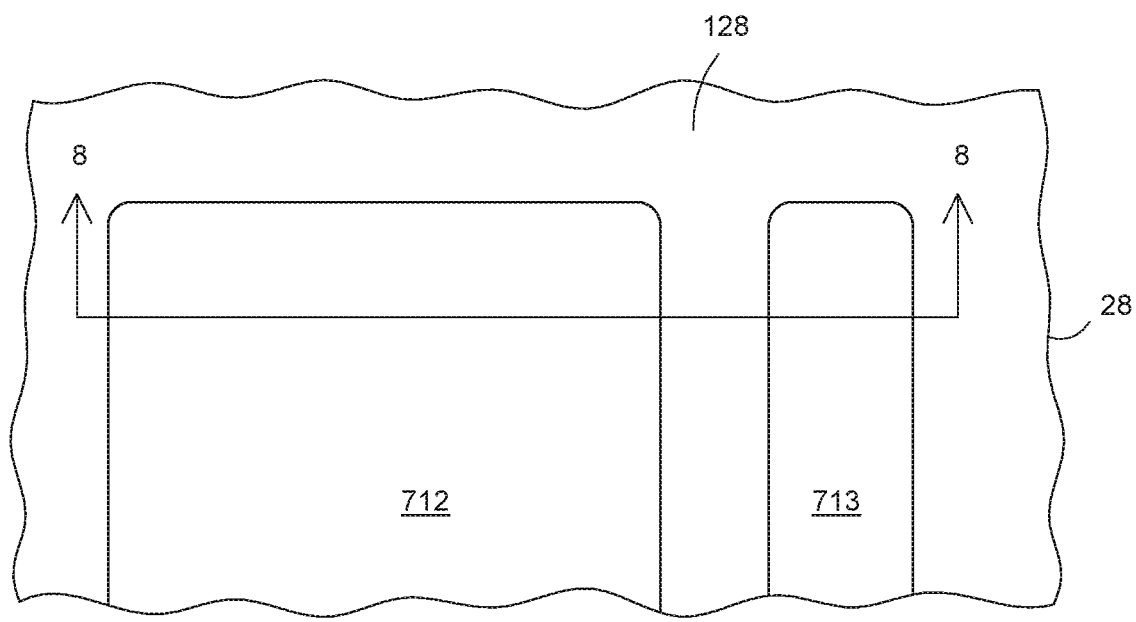
FIG. 7 illustrates a partial top view of a group III-V transistor structure with an integrated clamping device in accordance with another embodiment of the present invention.
Figure 8:
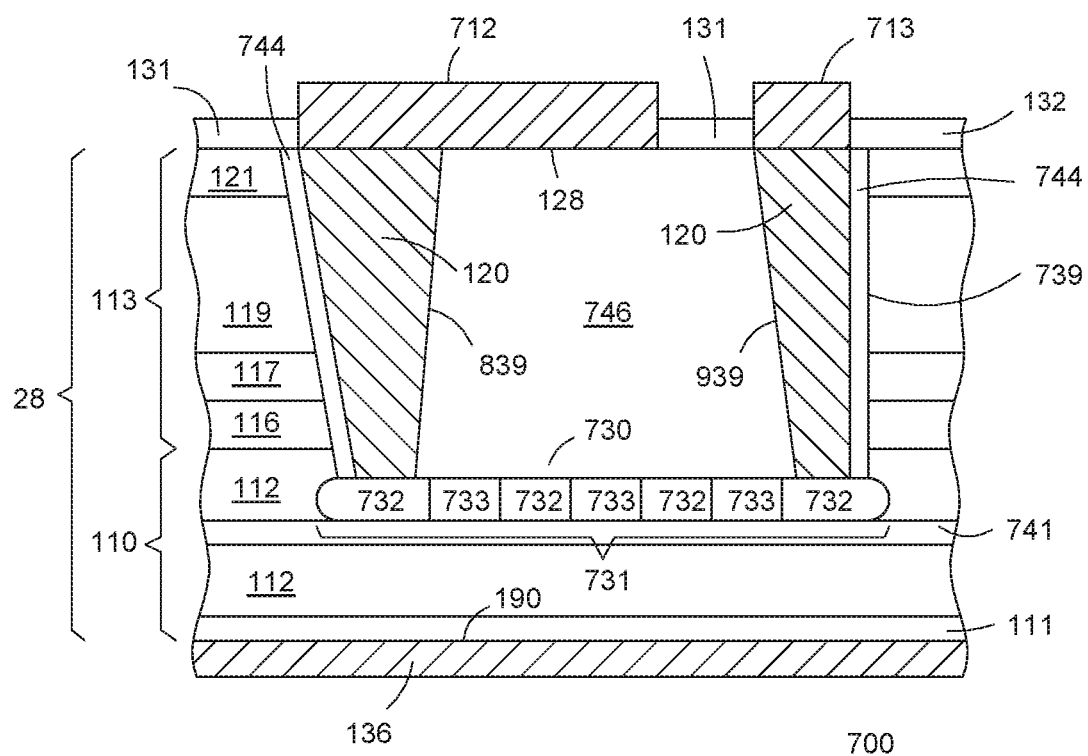
FIG. 8 illustrates a partial cross-sectional view of a group III-V transistor structure with an integrated clamping device taken along reference line 8-8 of FIG. 7.

FIG. 7 illustrates a top view of a group III-V transistor structure or device 700 with a clamping device 730 in accordance with another embodiment. FIG. 8 illustrates a partial cross-sectional view of group III-V transistor structure 700 taken along reference line 8-8 of FIG. 7. Group III-V transistor structure 700 is an alternative method and structure for incorporating a silicon-based clamping device with avalanche capability into a group III-V transistor device. As illustrated in FIG. 7, group III-V transistor structure 700 includes a drain electrode 712 and another electrode 713 spaced apart and disposed on major surface 128 of semiconductor substrate 28. In the present embodiment, electrode 713 can be configured as an anode electrode for group III-V transistor structure 700.

As illustrated in FIG. 8, group III-V transistor structure 700 is an example embodiment of a structure where clamping device 730 includes a plurality (i.e., more than one) of back-to-back p-n diode devices 731. In one embodiment, p-n diode devices 731 include a plurality of n-type regions 732 each laterally separated by a p-type region 733 disposed within semiconductor region 112. In some embodiments, a dielectric layer 741 is disposed within semiconductor region 112 and can be, for example, a buried oxide or BOX layer formed using ion implantation techniques or other techniques as known to those of ordinary skill in the art. In one embodiment, a trench 739 is formed extending from major surface 128 through heterostructure 113 and into a portion of semiconductor region 112, but leaving a portion of semiconductor region 112 above dielectric layer 741. In some embodiments, photomasking techniques and ion implantation and diffusion or anneal techniques can be used to form n-type regions 732 and p-type regions 733 adjacent dielectric layer 741 and adjacent a bottom surface of trench 739.

In an alternative embodiment, clamping device 730 can be formed using a polysilicon layer disposed, for example proximate to dielectric layer 741.

In a subsequent step, trench 739 can be filled with a dielectric region 746. In one embodiment, dielectric material 746 can be silicon oxide, silicon nitride, aluminum nitride, combinations thereof, or other insulative materials as known to those of ordinary skill in the art. Next, photolithographic and etch techniques can be used to form trench 839 extending through dielectric region 746 to a first n-type region 732 and to form a trench 939 extending to another n-type region 732 as illustrated in FIG. 8. In some embodiments, exposed portions of heterojunction structure 113 and be insulated with a dielectric layer 744. Trenches 839 and 939 can be filled with conductive material 120 followed by the formation of drain electrode 712 and second electrode 713.

Group III-V transistor structure 700 is different from the previous embodiments because the current path of clamping device 731 is parallel to the current path of the active device. However, the current path of clamping device 731 is advantageously laterally separated (i.e., the two current paths do not overlap) from the current path of the active device to reduce any interaction between the two paths. In a cascode switch configuration, second electrode 713 can be electrically connected to the source electrode of the normally-off silicon MOSFET device and can be further connected to a ground node. It is understood that conductive electrodes 120 can be the same material as drain electrode 712 and second electrode 713 or different materials.

Figure 9:
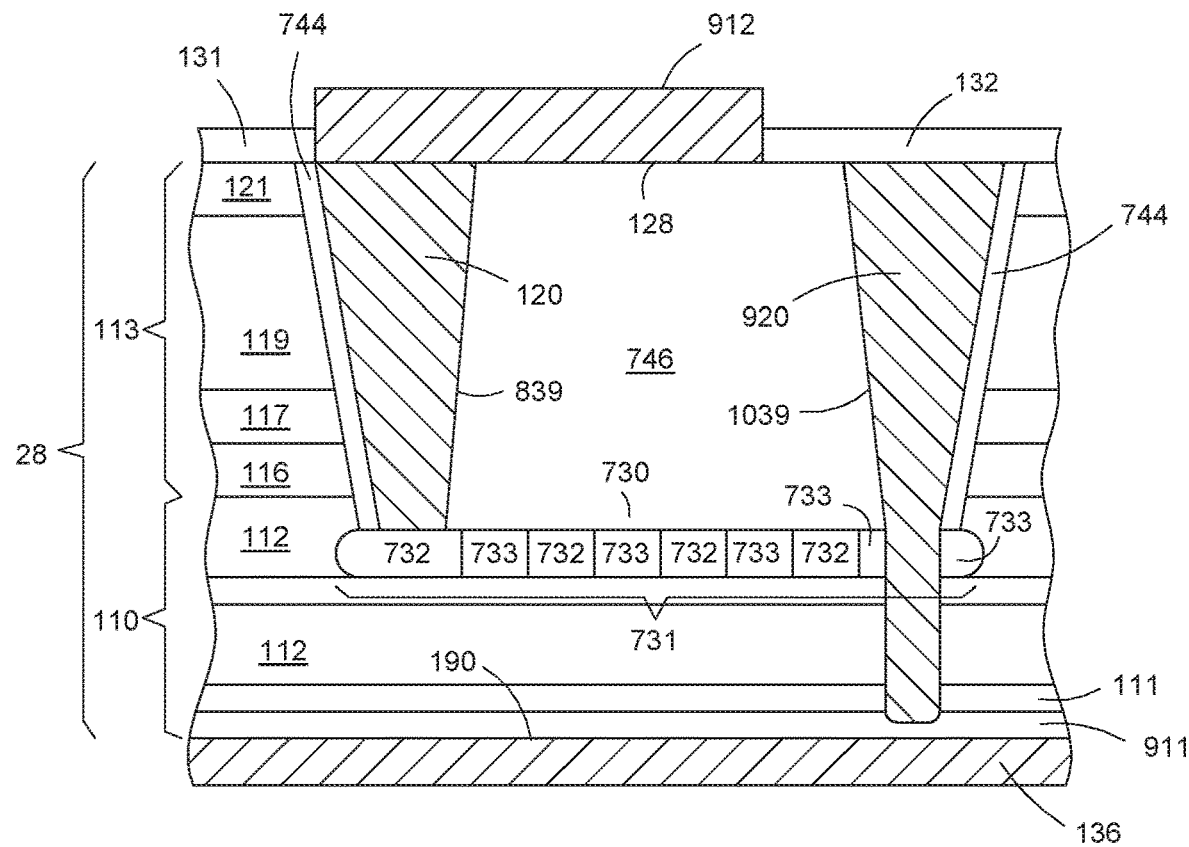
FIG. 9 illustrates a partial cross-sectional view of a group III-V transistor structure with an integrated clamping device in accordance with a further embodiment of the present invention.

FIG. 9 illustrates a partial cross-sectional view of a group III-V transistor structure or device 900 with a clamping device 730 in accordance with a further embodiment. Group III-V transistor structure 900 is similar to group III-V transistor structure 700 and only the differences will be described hereinafter. Specifically in group III-V transistor structure 900 trench 1039 is etched proximate to doped region 111 of substrate 110 to place conductive electrode 920 proximate to electrode 136. In some embodiments, a high doped region 911 can be formed proximate to major surface 190 of substrate 110 to improve the contact between electrode 920 and electrode 136. In this embodiment, second electrode 713 is optionally excluded with electrode 136 providing an anode electrode for clamping device 730. Further, this embodiment provides a clamping device having a horizontal current path laterally separated (i.e., the two current paths do not overlap) from the current path of the active device to reduce any interaction between the two paths.

Turning now to FIGS. 10-13, alternative embodiments are described having an integrated clamping device with reduced reverse recovery performance and that further facilitate connecting the substrate electrically to ground. More particularly, when a clamping diode is used to provide avalanche capability, the diode can induce a reverse recovery time resulting in switching losses in some applications. The present embodiments are configured to address, among other things, such reverse recovery losses.

Figure 10:
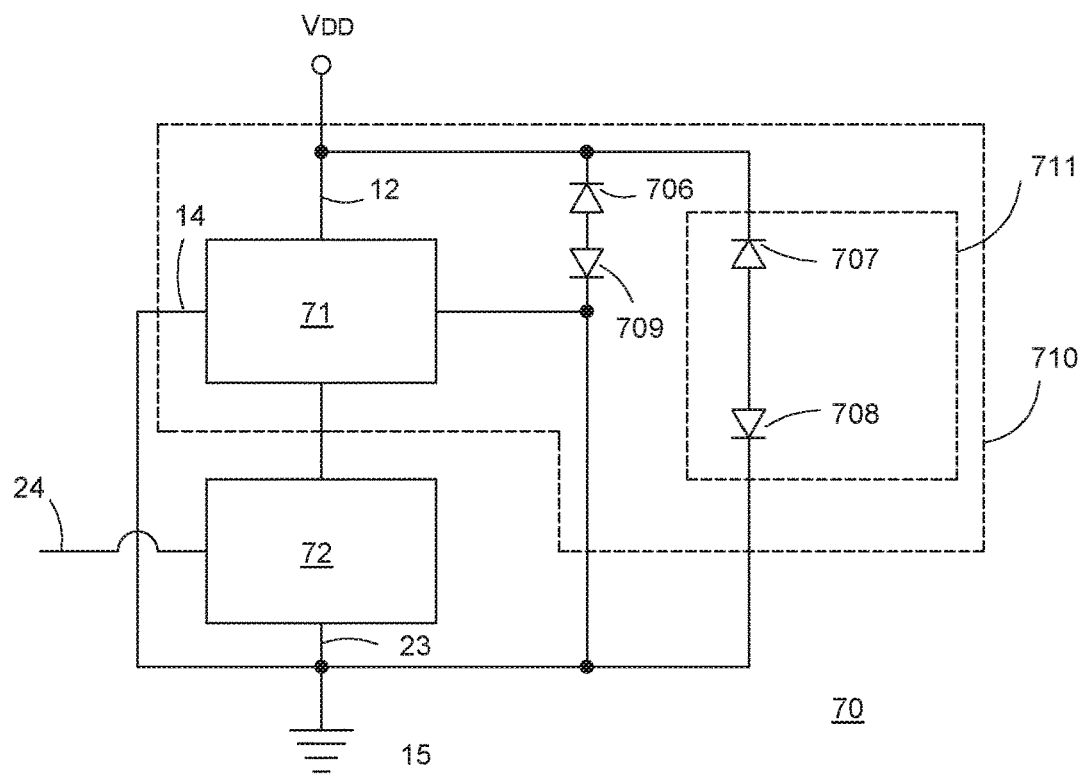
FIG. 10 illustrates a circuit schematic of a cascode switch structure including a clamping device configured to reduce reverse recovery in accordance with an embodiment of the present invention.

FIG. 10 illustrates a circuit schematic of a cascode switch structure 70 having a normally-on device, such as a group III-V transistor structure or device 71, a normally-off device, such as a silicon MOSFET device 72, a first diode 706, a second diode 707, a third diode 708, and a fourth diode 709 in accordance with one embodiment. More particularly, in accordance with the present embodiment, cascode switch structure 70 is an embodiment having avalanche capability with reduced reverse recovery constraints. In accordance with one embodiment, group III-V transistor structure 71 is integrated with diodes 706-709 within the same semiconductor region to provide an integrated structure 710 having reduced reverse recovery performance. In an alternative embodiment of cascode switch structure 70, diode 707 and diode 708 can be placed in a back-to-back configuration external to group III-V transistor device 71 and silicon MOSFET device 72 to provide a discrete embodiment 711. In this alternative embodiment, diode 706 and diode 709 can be optionally eliminated. In the alternative embodiment, the cathode of diode 707 is configured to be electrically connected to drain 12 of group III-V transistor device 71; the anode of diode 707 is electrically connected to the anode of diode 708; and the cathode of diode 708 is electrically connected to ground node 15 and/or to source 23 of silicon MOSFET device 72.

Figure 11:
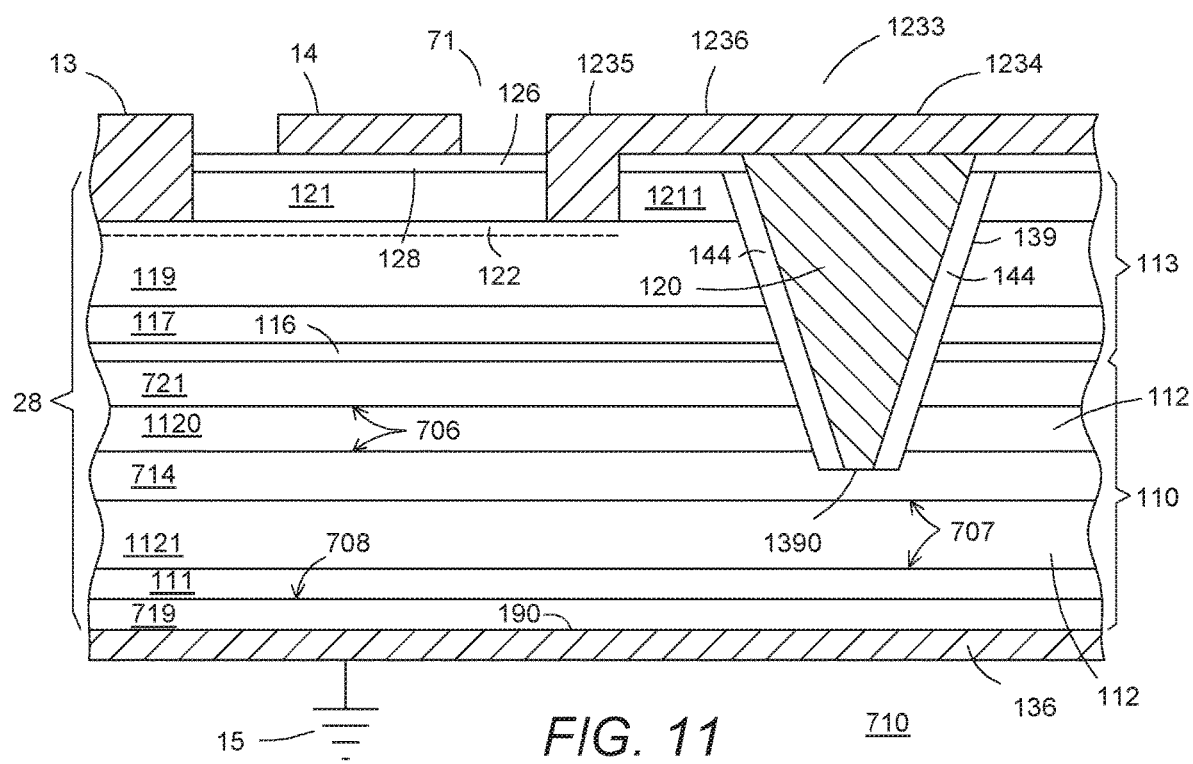
FIG. 11 illustrates a partial cross-sectional view of a group III-V transistor structure with an integrated clamping device having reduced reverse recovery in accordance with an embodiment of the present invention.

FIG. 11 illustrates a partial cross-sectional view of integrated structure 710 in accordance with one embodiment. Group III-V transistor structure 71 is similar to, for example, group III-V transistor structure 303, and is another example of a bond-over-active configuration. Only the differences between group III-V transistor 71 and group III-V transistor structure 303 will be described in detail hereinafter. In group III-V transistor 71, drain finger 1233 can be wider than drain finger 123 in group III-V transistor structure 303 so that trench 139 and conductive electrode 120 are more laterally separated from the active area of group III-V transistor structure 71. More particularly, drain finger 1233 includes a first part 1235 that makes ohmic contact to 2DEG region 122, a second part 1234 that makes contact to conductive electrode 120, and a third part 1236 that interconnects first part 1235 to second part 1234. In an alternative embodiment, trench 139 can be narrower in group III-V transistor structure 71 compared to group III-V transistor structure 303.

In the present embodiment, substrate 110 has a different configuration in order to include diodes 706-709. It is understood that the description of the present embodiment can be used with the other group III-V transistor structures (for example, the other drain electrode configurations) described herein. In one embodiment, a doped region 714 having n-type conductivity extends laterally across substrate 100 and makes electrical contact with conductive electrode 120 at surface 1390 of trench 139. In one embodiment, doped region 714 is an n−/n/n+/n/n− region, and can be formed using epitaxial growth techniques, buried layer formation techniques, ion implantation and anneal techniques, or other techniques as known to those of ordinary skill in the art. In one embodiment, the n+ of the doped region 714 adjoins conductive electrode 120 and the dopant concentration preferably decreases in a predetermined manner extending away from conductive electrode 120 is two vertical directions towards major surfaces 128 and 190.

In the present embodiment, semiconductor region 112 includes parts 1120 and 1121, which each can be intrinsically doped and/or can be lightly doped p-type as in previous embodiments. In one embodiment, the thickness of part 1120 is greater than the thickness of part 1121 to support first diode 706 having a greater breakdown voltage than second diode 707. Doped region 111 can be doped p+/p/p− as in previous embodiments. In accordance with the present embodiment, substrate 110 further includes a doped region 719 and a doped region 721. More particularly, doped region 719 is n-type, and can have a n+/n/n− dopant profile with the n+ portion adjoining major surface 190 and the dopant concentration decreasing inward in a predetermined manner from major surface 190. Doped region 721 is a p-type region, and can have a p+/p/p-dopant profile with the p+ portion adjoining seed layer 116 and the dopant concentration decreasing in a predetermined manner towards major surface 190. Doped region 721 and doped region 719 can be formed using ion implantation and anneal techniques, epitaxial formation techniques, or other techniques as known to those of ordinary skill in the art. As illustrated in FIG. 11, doped region 714, semiconductor region 1120 and doped region 721 define first diode 706; doped region 714, semiconductor region 1121, and doped region 111 define second diode 707; and doped region 111 and doped region 719 define third diode 708. In accordance with the present embodiments, the dopant profiles can be determined based on factors including, but not limited to, the desired breakdown voltage of the various clamping device structures or regions. In accordance with one preferred embodiment, the breakdown voltage of first diode 706 is greater than the breakdown voltage of second diode 707 so that the interface between semiconductor substrate 110 and heterostructure 113 is maintained at a ground potential.

Figure 12:
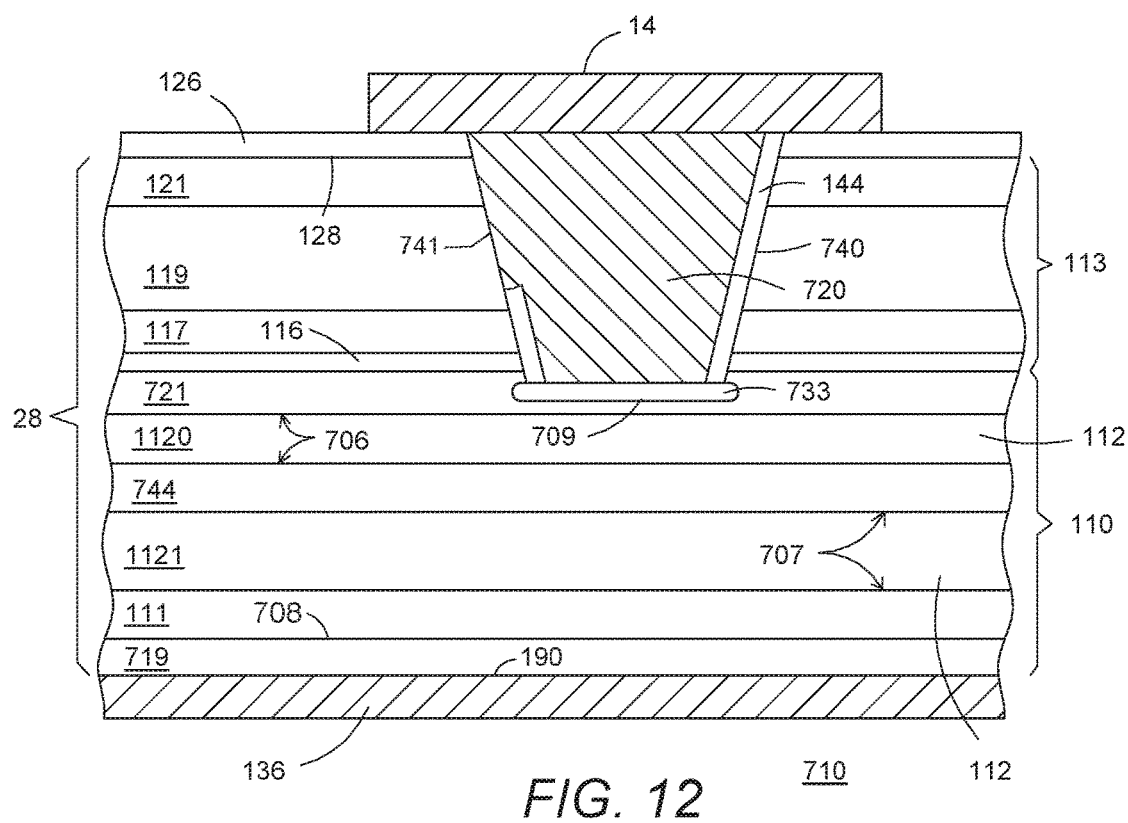
FIG. 12 illustrates a partial cross-sectional view of another portion of the group III-V transistor structure illustrated in FIG. 11.

FIG. 12 is a partial cross-sectional view of another portion of integrated structure 710 to illustrate one embodiment for the placement of fourth diode 709 within integrated structure 710. In one embodiment, a trench 740 is disposed extending from major surface 128 through heterostructure 113 into doped region 721. In one embodiment, insulating layer 144 is provided along sidewall surfaces of trench 739. In accordance with the present embodiment, a doped region is disposed adjoining the lower surface of trench 740 and a conductive electrode 720 is disposed within trench 740 and electrically contacting doped region 733. In one embodiment, doped region 733 is an n-type region, such as an n+/n/n− doped region with the n+ portion adjoining conductive contact 720. The dopant concentration can decrease extending downward away from conductive contact 720 in a predetermined manner Doped region 733 can be formed using ion implantation and anneal techniques or using other techniques as known to those of ordinary skill in the art and can be conveniently formed through trench 740. In accordance with the present embodiment, doped region 733 and doped region 721 define fourth diode 709. Gate pad 14 is electrically connected to conductive electrode 720 as generally illustrated in FIG. 12. In alternative embodiment, insulating layer 144 along the sidewalls of trench 740 can be eliminated as generally illustrated along sidewall 741 of trench 740 in FIG. 12. In this embodiment, 2DEG channel 121 is removed in the region of heterostructure 113 using, for example, the ion implantation process described previously. In the absence of 2DEG channel 121, leakage and/or breakdown issues are reduced.

In accordance with the present embodiment, second diode 707 is an avalanche diode configured to have a breakdown voltage substantially the same or higher compared to the rated voltage of group III-V transistor structure 71. In one embodiment, third diode 708 is placed in series with second diode 707 to provide a conduction path by being forward biased during, for example, a UIS event. When the drain electrode 12 of group III-V transistor structure 71 undergoes a negative bias, second diode 707 is prevented from going into a forward bias condition by third diode 708. Thus, in accordance with the present embodiment, the breakdown voltage of third diode 708 is selected to be higher than the highest or peak negative voltage that the drain of the cascode system will be subjected to in the specified application. The peak negative drain voltage is determined by the voltage at which the active cascode starts conducting. In one embodiment, the second diode 707 and third diode 708 are configured in series to form a floating base n-p-n bipolar transistor. To prevent this bipolar transistor from turning doped region 111 is configured to reduce the carriers from the emitter and reduce the gain significantly. In one embodiment, semiconductor region 1121 also helps in reducing the gain of the bipolar transistor. In some embodiments, third diode 708 does not require the same area as second diode 707. Since third diode 708 is forward biased to provide a conduction path during a UIS event, such an event is similar to a surge event for a p-n/p-i-n diode. Thus, the size or surface area of the third diode 708 can be made smaller than second diode 707. This feature of the present embodiment helps in reducing the total capacitance contribution from second diode 707 and third diode 708 to cascode system 700 thereby significantly reducing the impact on system performance.

In one embodiment, first diode 706 is added to facilitate placing the substrate 110/heterostructure 113 interface at ground potential. It is noted that in some embodiments, first diode 706 and fourth diode 709 are not necessary for providing UIS capability to the system. However, in embodiments where it is necessary or desired for substrate 110 to be grounded or placed close to ground potential, then first diode 706 and fourth diode 709 can be added. In one embodiment, first diode 706 is designed to have a higher breakdown voltage in comparison to second diode 707 so that first diode 706 does not breakdown under UIS events. When the drain voltage goes negative in cascode system 70, first diode 706 can be forward biased and in order to prevent reverse recovery, fourth diode 709 is configured to block any conduction path and therefore no reverse recovery exists thereby improving the reverse recovery losses of the system.

Figure 13:
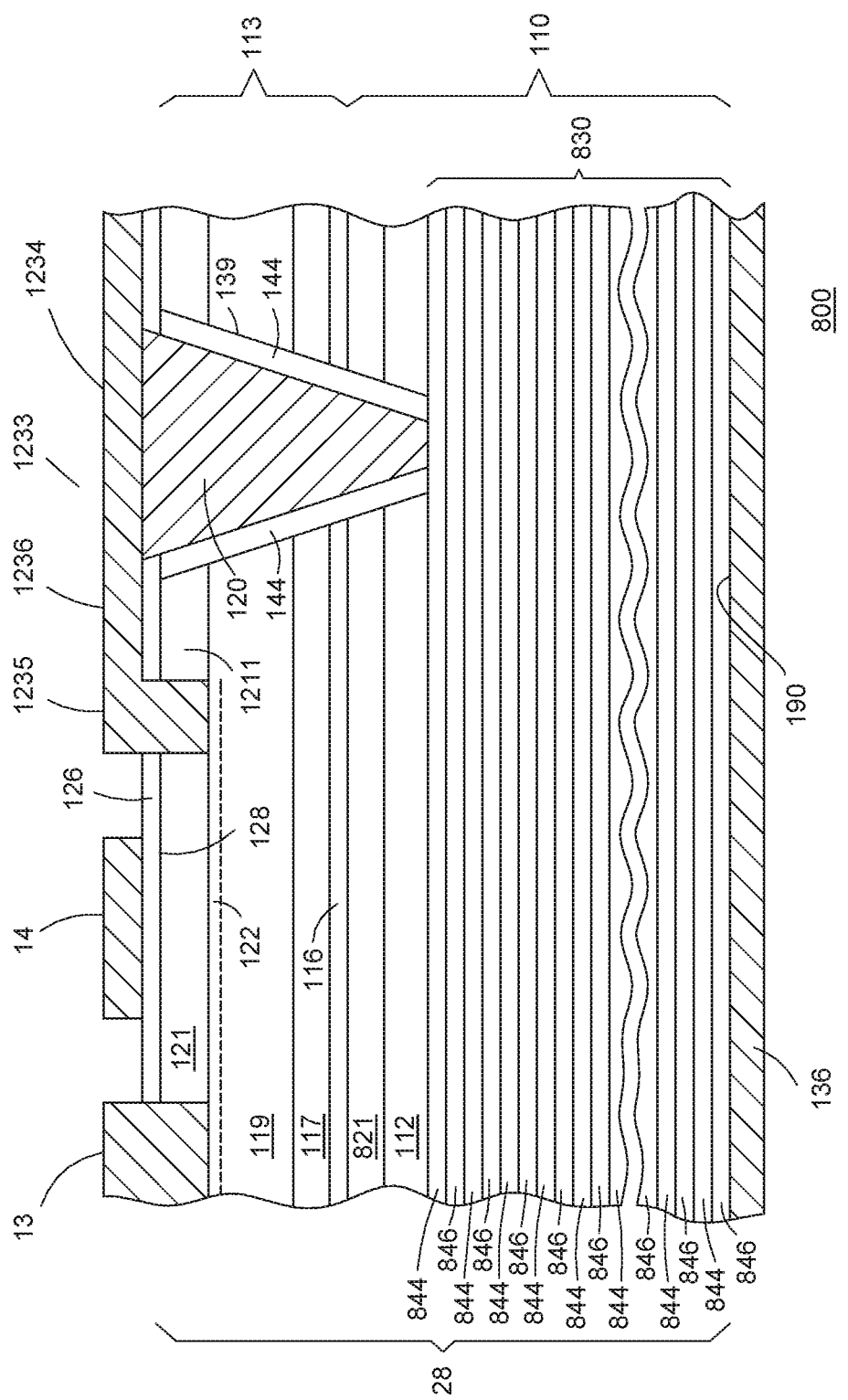
FIG. 13 illustrates a partial cross-sectional view of a group III-V transistor structure having an integrated clamping device in accordance with a still further embodiment of the present invention.

FIG. 13 illustrates a partial cross-sectional view of a group III-V transistor structure or device 800 with an integrated clamping device 830 in accordance with another embodiment. Group III-V transistor structure 800 is similar, for example, to group III-V transistor structures 303 and 71, and only the differences are described hereinafter. Specifically, substrate 110 is different in group III-V transistor device 800 and is configured to include clamping structure 830, which is electrically connected to conductive electrode 120 in trench 139 and drain electrode 1233, and electrically connected to conductive electrode 136 on major surface 190 of substrate 110. In the present embodiment, clamping device 830 includes a plurality of back-to-back connected p-n diodes. In accordance with the present embodiment, the plurality of n-type regions 844 and a plurality of p-type regions 846 are provided in a back-to-back p-n diode configuration having a higher breakdown voltage in comparison to the rated breakdown voltage of group III-V transistor device 800. Regions 844 and 846 can be formed using ion implantation and annealing techniques, epitaxial growth techniques, or other techniques as known to those of ordinary skill in the art.

In accordance with the present embodiment, clamping device 830 is configured to breakdown during a UIS event and to provide avalanche capability for group III-V transistor structure 800. The present embodiment further includes a doped region 821, which can be p-type region, such as a p+/p/p− region as described in other embodiments. In the present embodiment, doped region 821 is included to facilitate placing the interface between heterostructure 113 and substrate 110 at the source potential of the cascode system. In accordance with the present embodiment, the diode formed by doped region 821 and semiconductor region 112 is configured to have a higher breakdown voltage than clamping device 830. By way of example, contact to doped region 821 can be facilitated using a trench electrode between gate electrode 14 and doped region 821 in a similar manner as that illustrated in FIG. 12. Doped region 733 can also be included in the gate trench contact to reduce any reverse recovery of the diode between doped region 821 and semiconductor region 112. In one embodiment, n-type region 844 and p-type regions 846 can be terminated along one or more edges of group III-V transistor device 800 using one or more dielectric regions.

Figure 14:
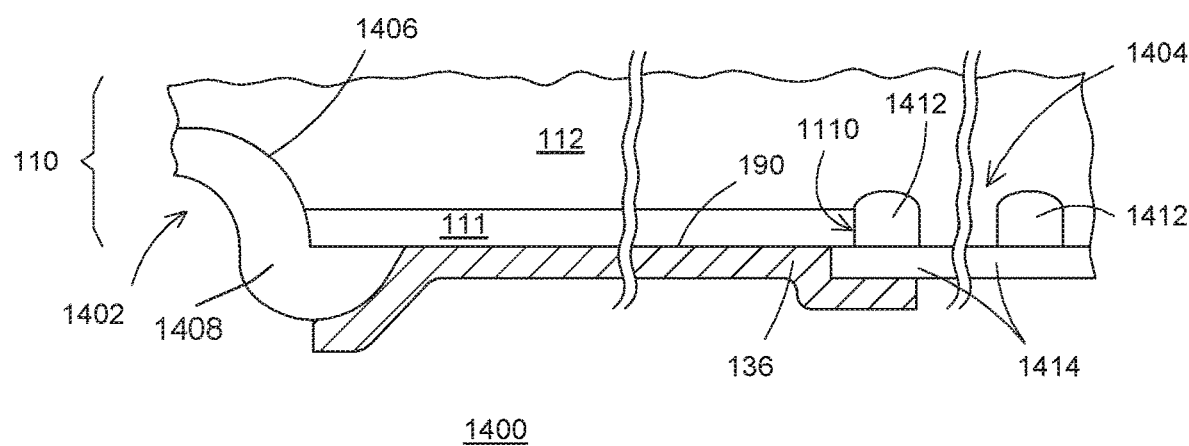
FIG. 14 illustrates a partial cross-sectional view of portions of edge termination structures for a group III-V transistor structure having an integrated clamping device in accordance with embodiments of the present invention.

Turning now to FIG. 14, which illustrates a partial cross-sectional view of a group III-V transistor structure 1400 in accordance with additional embodiments. In particular, structure 1400 illustrates example edge termination structures 1402 and 1404 that can be used with embodiments described previously for terminating the clamping devices. In one embodiment, edge termination structure 1402 comprises a trench or moat structure 1406 disposed extending from major surface 190 towards an inner portion of substrate 110. In one embodiment, trench 1406 extends past doped region 111. Edge termination structure 1402 further comprises a dielectric region 1408, such as an oxide, a glass, photo-glass, or other dielectric materials as known to those of skill in the art. Edge termination structure 1404 comprises a plurality of doped rings 1412 disposed extending inward from major surface 190. In one embodiment, doped rings 1412 can be p-type doped rings disposed adjacent to an edge 1110 of doped region 111. Doped rings 1412 can have varied spacing, varied depths, and/or varied lateral widths. In one embodiment, edge termination structure 1404 further comprises a dielectric layer 1414 disposed on or over a portion of major surface 190 where doped rings 1412 are located. In one embodiment, dielectric layer 1414 can comprise an oxide, a nitride, polyimide, combinations thereof, or other suitable materials as known to those of skill in the art.

Those skilled in the art will recognize that, in accordance with one embodiment, a cascode switch structure comprises a group III-V transistor structure (for example, element 11, 71) having a first current carrying electrode (for example, element 13), a second current carrying electrode (for example, element 12), and a first control electrode (for example, element 14). A semiconductor MOSFET device (for example, element 21, 72) includes a third current carrying electrode (for example, element 22) electrically connected to the first current carrying electrode, a fourth current carrying electrode (for example, element 23) electrically connected to the first control electrode, and a second control electrode. A first diode (for example, element 707) includes a first cathode electrode configured to be electrically connected to a load and electrically connected to the second current carrying electrode and a first anode electrode electrically connected to a second anode of a second diode (for example, element 708), wherein the second diode has a second cathode electrically connected to the fourth current carrying electrode, and wherein the first diode and the second diode are in a back-to-back configuration. In another embodiment, the second current carrying electrode is configured to receive a peak negative voltage, and the second diode is configured to have a breakdown voltage greater than the peak negative voltage. In a further embodiment, the first diode has a greater breakdown voltage than the second diode. In a still further embodiment, the second diode has a smaller surface area than the first diode. In another embodiment, the second diode has a smaller capacitance than the first diode.

In view of all of the above, it is evident that novel UIS capable structures and methods of making the same. Included, among other features, are structures capable of providing avalanche protection are integrated with group III-V transistor structures to provide the enhanced UIS capability. The present embodiments provide, among other things, configurations to integrate a device into the cascode circuit so as to avoid being a discrete solution requiring co-packaging and its associated costs and parasitic issues.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, a silicon substrate of the group III-V transistor structure can have various epitaxial or doped layers of different concentrations. Additionally, the diode can be formed by ion implanting in the trenches in the drain region into the substrate to form n/p layers. Further, a Schottky clamp device can be provided using a Schottky barrier as part of or as the back side electrode and having the substrate one conductivity type, such as n-type conductivity. Still further, the structure can use separated regions with the active device/channel from the region with forming the diodes. In other embodiments, the substrate can be coupled to potentials other than ground or can be left floating.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A cascode switch structure, comprising:
a group III-V transistor structure having a first current carrying electrode, a second current carrying electrode and a first control electrode;
a semiconductor MOSFET device having a third current carrying electrode electrically coupled to the first current carrying electrode, a fourth current carrying electrode electrically coupled to the first control electrode, and a second control electrode;
a first diode having a first cathode electrode electrically coupled to the second current carrying electrode and a first anode electrode; and
a second diode having a second anode electrode electrically coupled to the first anode electrode and a second cathode electrode electrically coupled to the fourth current carrying electrode.

2. The cascode switch structure of claim 1, wherein:
the second current carrying electrode is configured to receive a peak negative voltage for the cascode switch structure; and
the second diode is configured to have a breakdown voltage greater than the peak negative voltage.

3. The cascode switch structure of claim 1, wherein the first diode has a greater breakdown voltage than that of the second diode.

4. The cascode switch structure of claim 1, wherein the second diode has a smaller capacitance than that of the first diode.

5. The cascode switch structure of claim 1, wherein:
the group III-V transistor structure, the first diode, and the second diode comprise an integrated structure comprising:

a semiconductor substrate having a first major surface and an opposing second major surface;
a heterostructure adjacent the first major surface, the heterostructure comprising:
a channel layer; and
a barrier layer over the channel layer;
the first current carrying electrode disposed proximate to a first portion of the channel layer;
the second current carrying electrode disposed proximate to a second portion of the channel layer and spaced apart from the first current carrying electrode, wherein the second current carrying electrode is electrically decoupled from the semiconductor substrate;
the first control electrode disposed between the first current carrying electrode and the second current carrying electrode and configured to control a first current path between the first current carrying electrode and the second current carrying electrode;
a conductive electrode disposed on the second major surface of the semiconductor substrate;
a first trench electrode extending through the heterostructure into the semiconductor substrate, wherein the first trench electrode is electrically coupled to the second current carrying electrode;
a first doped region of a first conductivity type disposed in the semiconductor substrate adjacent the first trench electrode;
a second doped region of a second conductivity type opposite to the first conductivity type disposed in the semiconductor substrate between the second major surface and the first doped region;
a first semiconductor region disposed between the first doped region and the second doped region; and
a third doped region of the first conductivity type disposed between the second major surface and the second doped region;
the first diode includes the first doped region, the first semiconductor region and the second doped region; and
the second diode includes the second doped region and the third doped region.

6. The cascode switch structure of claim 5, wherein:
the first doped region comprises an n-type region having an n−/n/n+/n/n− dopant profile with the n+ portion of the n−/n/n+/n/n− dopant profile adjoining the first trench electrode;
the second doped region comprises a p-type region; and
the third doped region comprises an n-type region having an n+/n/n− dopant profile with the n+ portion of the n+/n/n− dopant profile adjoining the second major surface.

7. The cascode switch structure of claim 6, wherein the first semiconductor region comprises one of an intrinsic region or a p-type doped region.

8. The cascode switch structure of claim 5, further comprising:
a second semiconductor region disposed between the first doped region and the heterostructure; and
a fourth doped region of the second conductivity type disposed between the second semiconductor region and the heterostructure, wherein:
the first doped region, the second semiconductor region, and the fourth doped region define a third diode; and
the third diode is configured to have a higher breakdown voltage than the first diode.

9. The cascode switch structure of claim 8, further comprising:
a second trench electrode extending through the heterostructure into the semiconductor substrate and terminating within the fourth doped region; and
a fifth doped region of the first conductive type disposed within the fourth doped region and adjoining the second trench electrode, wherein:
the fifth doped region and the fourth doped region define a fourth diode; and
the second trench electrode is electrically coupled to the first control electrode.

10. A cascode switch structure, comprising:
a group III-V transistor structure having a first current carrying electrode, a second current carrying electrode and a first control electrode;
a semiconductor MOSFET device having a third current carrying electrode electrically coupled to the first current carrying electrode, a fourth current carrying electrode electrically coupled to the first control electrode, and a second control electrode;
a first diode having a first cathode electrode electrically coupled to the second current carrying electrode and a first anode electrode; and
a second diode having a second anode electrode electrically coupled to the first anode electrode and a second cathode electrode electrically coupled to the fourth current carrying electrode, wherein the first diode has a greater breakdown voltage than that of the second diode.

11. The cascode switch structure of claim 10, wherein:
the second current carrying electrode is configured to receive a peak negative voltage for the cascode switch structure;
the second diode is configured to have a breakdown voltage greater than the peak negative voltage; and
the second diode has a smaller capacitance than that of the first diode.

12. The cascode switch structure of claim 10, wherein:
the group III-V transistor structure, the first diode, and the second diode comprise an integrated structure comprising:
a semiconductor substrate having a first major surface and an opposing second major surface;
a heterostructure adjacent the first major surface, the heterostructure comprising:
a channel layer; and
a barrier layer over the channel layer;
the first current carrying electrode disposed proximate to a first portion of the channel layer;
the second current carrying electrode disposed proximate to a second portion of the channel layer and spaced apart from the first current carrying electrode, wherein the second current carrying electrode is electrically decoupled from the semiconductor substrate;
the first control electrode disposed between the first current carrying electrode and the second current carrying electrode and configured to control a first current path between the first current carrying electrode and the second current carrying electrode;
a conductive electrode disposed on the second major surface of the semiconductor substrate;
a first trench electrode extending through the heterostructure into the semiconductor substrate, wherein the first trench electrode is electrically coupled to the second current carrying electrode;

a first doped region of a first conductivity type disposed in the semiconductor substrate adjacent the first trench electrode;
a second doped region of a second conductivity type opposite to the first conductivity type disposed in the semiconductor substrate between the second major surface and the first doped region;
a first semiconductor region disposed between the first doped region and the second doped region; and
a third doped region of the first conductivity type disposed between the second major surface and the second doped region;
the first diode includes the first doped region, the first semiconductor region and the second doped region; and
the second diode includes the second doped region and the third doped region.

13. The cascode switch structure of claim 12, wherein:
the first doped region comprises an n-type region having an n−/n/n+/n/n− dopant profile with the n+ portion of the n−/n/n+/n/n− dopant profile adjoining the first trench electrode;
the second doped region comprises a p-type region; and
the third doped region comprises an n-type region having an n+/n/n− dopant profile with the n+ portion of the n+/n/n− dopant profile adjoining the second major surface.

14. The cascode switch structure of claim 13, wherein the first semiconductor region comprises one of an intrinsic region or a p-type doped region.

15. The cascode switch structure of claim 12, further comprising:
a second semiconductor region disposed between the first doped region and the heterostructure; and
a fourth doped region of the second conductivity type disposed between the second semiconductor region and the heterostructure, wherein:
the first doped region, the second semiconductor region, and the fourth doped region define a third diode; and
the third diode is configured to have a higher breakdown voltage than the first diode.

16. The cascode switch structure of claim 15, further comprising:
a second trench electrode extending through the heterostructure into the semiconductor substrate and terminating within the fourth doped region; and
a fifth doped region of the first conductive type disposed within the fourth doped region and adjoining the second trench electrode, wherein:
the fifth doped region and the fourth doped region define a fourth diode; and
the second trench electrode is electrically coupled to the first control electrode.

17. A semiconductor device structure comprising:
a semiconductor substrate having a first major surface and an opposing second major surface;
a heterostructure adjacent the first major surface, the heterostructure comprising:
a channel layer; and
a barrier layer over the channel layer;
a first electrode disposed proximate to a first portion of the channel layer;
a second electrode disposed proximate to a second portion of the channel layer and spaced apart from the first electrode;
a third electrode disposed on the second major surface of the semiconductor substrate;
a first control electrode disposed between the first electrode and the second electrode and configured to control a first current path between the first electrode and the second electrode;
a fourth electrode disposed at least in part proximate to the first major surface, wherein the fourth electrode is electrically coupled to the first electrode; and
a clamping device disposed in the semiconductor substrate and electrically coupled to the fourth electrode, wherein the clamping device comprises a plurality of n-type regions and a plurality of p-type regions disposed in the semiconductor substrate in a back-to-back p-n diode configuration.

18. The semiconductor device structure of claim 17, wherein:
the second electrode is electrically decoupled from the semiconductor substrate; and
the clamping device is further electrically coupled to the third electrode.

19. The semiconductor device structure of claim 18, wherein:
the first control electrode is electrically decoupled from the semiconductor substrate;
the semiconductor device structure is further provided in combination with a semiconductor MOSFET device having a third current carrying electrode electrically coupled to the second current carrying electrode, a fourth current carrying electrode electrically coupled to the first control electrode, and a second control electrode; and
the combination comprises a cascode switch structure.

20. The semiconductor device structure of claim 17, wherein the back-to-back p-n diode configuration is disposed adjoining a dielectric layer within the semiconductor substrate.

* * * * *